US012346010B2

(12) United States Patent
Elsasser et al.

(10) Patent No.: US 12,346,010 B2
(45) Date of Patent: Jul. 1, 2025

(54) ALIGNMENT SYSTEM AND TOOL FOR VISUAL INSPECTION

(71) Applicant: INTERNATIONAL BUSINESS MACHINES CORPORATION, Armonk, NY (US)

(72) Inventors: Ryan Elsasser, Poughkeepsie, NY (US); Eric Mallery, East Hartford, CT (US); Enrico A. Romano, Dutchess, NY (US); Jason R. Eagle, Mantorville, MN (US); James Clark Utter, Hudson, NY (US); Daniel Ruiz, Cold Spring, NY (US); Joseph Scaglione, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 319 days.

(21) Appl. No.: 17/733,244

(22) Filed: Apr. 29, 2022

(65) Prior Publication Data

US 2023/0350278 A1 Nov. 2, 2023

(51) Int. Cl.
*G03B 17/00* (2021.01)
*F16M 11/20* (2006.01)
(Continued)

(52) U.S. Cl.
CPC ....... *G03B 17/561* (2013.01); *F16M 11/2085* (2013.01); *G03F 7/70716* (2013.01)

(58) Field of Classification Search
CPC .............. G03B 17/561; G03F 7/70716; G03F 7/70775; G03F 7/70825; G03F 7/70758; G03F 7/709; F16M 11/2085
(Continued)

(56) References Cited

U.S. PATENT DOCUMENTS 4,729,536 A * 3/1988 Scala ..................... B23Q 1/621
 108/143
6,788,385 B2 * 9/2004 Tanaka ................ G03F 7/70766
 355/72

(Continued)

FOREIGN PATENT DOCUMENTS

JP 2005283218 A 10/2005
KR 101559009 B1 * 10/2015
(Continued)

OTHER PUBLICATIONS

Grace Period Disclosure: Joseph Scaglione, "Iphone Stand Assembly", Apr. 1, 2021.
(Continued)

*Primary Examiner* — Mahdi H Nejad
(74) *Attorney, Agent, or Firm* — Tutunjian & Bitetto, P.C.; Michael A. Petrocelli

(57) ABSTRACT

An imaging device is provided that may be used for visually inspecting structures. In one embodiment, the imaging device includes an image capture device; and a rail system having a stationary component connected to the image capture device and a sliding component for movement along a horizontal axis. The system can further include a jig structure engaged to the sliding component of the rail system. The jig structure may include a first mount location for engagement to a first type connector and a second mount location for engagement to a second type connector. The jig structure is engaged to the sliding component to position the housing so that the first and second mount locations are in line and parallel to a direction of travel along the horizontal axis including a point at which the first and second mount locations pass through the imaging location.

17 Claims, 9 Drawing Sheets

(51) Int. Cl.
 *G03B 17/56* (2021.01)
 *G03F 7/00* (2006.01)
(58) Field of Classification Search
 USPC .......................................................... 269/56
 See application file for complete search history.

(56) References Cited

U.S. PATENT DOCUMENTS

| | | | |
|---|---|---|---|
| 7,068,906 B2 | 6/2006 | Bianchi et al. | |
| 7,239,788 B2 | 7/2007 | Villeneuve | |
| 10,031,427 B2* | 7/2018 | Johnston | G03F 7/70791 |
| 10,261,030 B2 | 4/2019 | Angermund et al. | |
| 12,117,732 B2* | 10/2024 | Laidig | G03F 7/2051 |
| 2002/0180312 A1* | 12/2002 | Tanaka | G03F 7/70716 |
| | | | 310/328 |
| 2002/0196421 A1* | 12/2002 | Tanaka | G03F 7/707 |
| | | | 355/75 |
| 2005/0182466 A1 | 8/2005 | Mahajan | |
| 2005/0189901 A1* | 9/2005 | Tanaka | B82Y 40/00 |
| | | | 318/649 |
| 2006/0204240 A1* | 9/2006 | Cameron | G03B 35/08 |
| | | | 396/419 |
| 2006/0285092 A1* | 12/2006 | Ono | G03F 7/70825 |
| | | | 355/75 |
| 2008/0205876 A1* | 8/2008 | Tegland | G03B 17/561 |
| | | | 396/428 |
| 2011/0096306 A1* | 4/2011 | Yoshimoto | G03F 7/70775 |
| | | | 355/75 |
| 2016/0170312 A1* | 6/2016 | Shibazaki | H01L 21/68742 |
| | | | 355/72 |
| 2017/0090303 A1* | 3/2017 | Johnston | G03F 7/709 |

FOREIGN PATENT DOCUMENTS

| | | | | |
|---|---|---|---|---|
| TW | 546551 B | * | 8/2003 | |
| TW | 200935189 A | * | 8/2009 | ......... G03F 7/70775 |

OTHER PUBLICATIONS

Grade Period Disclosure: Transmittal letter dated Jun. 29, 2023.
Park, Je-Kang et al. "Machine learning-based imaging system for surface defect inspection," International Journal of Precision Engineering and Manufacturing-Green Technology, Jul. 2016, pp. 303-310, 3.3.
Anonymous, "New FH Vision System with industry's first AI defect detection," OMRON Industrial Automation, https://industrial.omron.eu/en/news-events/news/fh-vision-system-with-ai, Sep. 2020, 2 pages.
Kuric, Ivan, et al. "Approach to Automated Visual Inspection of Objects Based on Artificial Intelligence," Applied Sciences, Jan. 2022, 864, 19 p. 12.2.
Anonymous, "Hybrid Vision System Inspects Highly Variable Electronic Product Mix," Kitov.ai, https:www.kitov.ai/ wp-content/uploads/2021/06/Kitov_USTech_v2.pdf, Jun. 2021, 4 pages.

* cited by examiner

ALIGNMENT SYSTEM AND TOOL FOR VISUAL INSPECTION

STATEMENT REGARDING PRIOR DISCLOSURES BY THE INVENTOR OR A JOINT INVENTOR

The following disclosure(s) are submitted under 35 U.S.C. 102(b)(1)(A): Applicant is aware of certain confidential activities provided to third parties. Applicant does not believe these activities constitute a disclosure or offer to sale of the claimed subject matter. The confidential activities were related to the Applicants' internal-only use of tools used to help provide generally available services to third parties.

BACKGROUND

The present disclosure generally relates to inspection methods and structures, and more particularly to visual inspection methods and structures.

Manufacturing applications of Artificial Intelligence (AI) and Machine Learning (ML) are emerging technologies within the broader scope of Industry 4.0 (I4.0). Increasing interconnectivity and smart automation from implementing AI and ML, in a manufacturing/production operation, drive unique process and equipment engineering challenges. Manufacturer and supply chains are dealing with increasing demand for and supply of highly integrated and complex electromechanical assemblies. Inspecting highly integrated complex assemblies with efficiency while simultaneously reducing consumer risk and producer risk is challenging. One solution to the challenge is the adoption of artificial intelligence (AI) and machine learning (ML) coupled with deeper integration into production operations.

SUMMARY

In accordance with one aspect of the present disclosure, a jig structure is provided that can be used to fix an object is space, yet can provide for controlled movement during the operation of an inspection function, which can include imaging. It has been determined that in some instances successfully embracing artificial intelligence (AI) and machine learning (ML) into visual inspection benefits from control of a rigid body's six degrees of freedom, in space. The structures and systems described herein allow for independent control and translation in a visual inspection system along at least three orthogonal axis.

In one aspect, a jig structure for use in a visual inspection system is provided. In one embodiment, the jig structure includes a base having an adapter for engagement to a sliding rail system that includes an imaging location. The base includes a first mount location having a reversible mount arrangement for engagement to a first type connector and a second mount location having a slot housing for engagement to a second type connector. The adapter is configured to position the housing so that the first and second mount locations are in line and parallel to a direction of travel for the base along the rail system including a point at which the first and second mount locations pass through the imaging location. The jig structure also includes at least one cable terminal retention housing configured for retaining the first type connector. The at least one cable terminal housing is connected by the reversible mount arrangement to the first mount location. The jig structure also includes an ejection plate including at least one ejection pin. The ejection plate is connected to the first mount location of the base, and is traversable across at least a first position and at least a second position. At the first position, the first connector type is retained to the at least one cable retention housing. In some embodiments, as the ejection plate is traversed to the second position an ejection force is applied through the at least one ejection pin to the first connector type to eject the first connector type from the at least one cable terminal retention housing.

In another aspect, a system for imaging is provided. The system for imaging includes an image capture device, and a rail system having a stationary component connected to the image capture device. The rail system also includes a sliding component for movement along a horizontal axis. The system can further include a jig structure engaged to the sliding component of the rail system. The jig structure may include a first mount location having a reversible mount arrangement for engagement to a first type connector and a second mount location having a slot housing for engagement to a second type connector. The jig structure is engaged to the sliding component to position the housing so that the first and second mount locations are in line and parallel to a direction of travel along the horizontal axis including a point at which the first and second mount locations pass through the imaging location.

In yet another aspect, a method of imaging is provided. In one embodiment, the method may include mounting a two terminal cable to a jig structure that includes a first mount location having a reversible mount arrangement for engagement to a first type connector of the two terminal cable of the jig structure, and a second mount location having a slot housing for engagement to a second type connector of the two terminal cable of the jig structure. The method may further include mounting the jig structure to a sliding component of a sliding rail system. The jig structure is engaged to the sliding component to position the first and second mount locations to be in line and parallel to a direction of travel along a horizontal axis including a point at which the first and second mount locations pass through the imaging location. In some embodiments, the method further includes taking images of the first and second type connectors with an image capture device mounted to a fixed component of the sliding rail system when the first and second mount locations of the jig structure that is mounted to the sliding component pass through the imaging location.

BRIEF DESCRIPTION OF THE DRAWINGS

The following description will provide details of preferred embodiments with reference to the following figures wherein.

DETAILED DESCRIPTION

Figure 1:
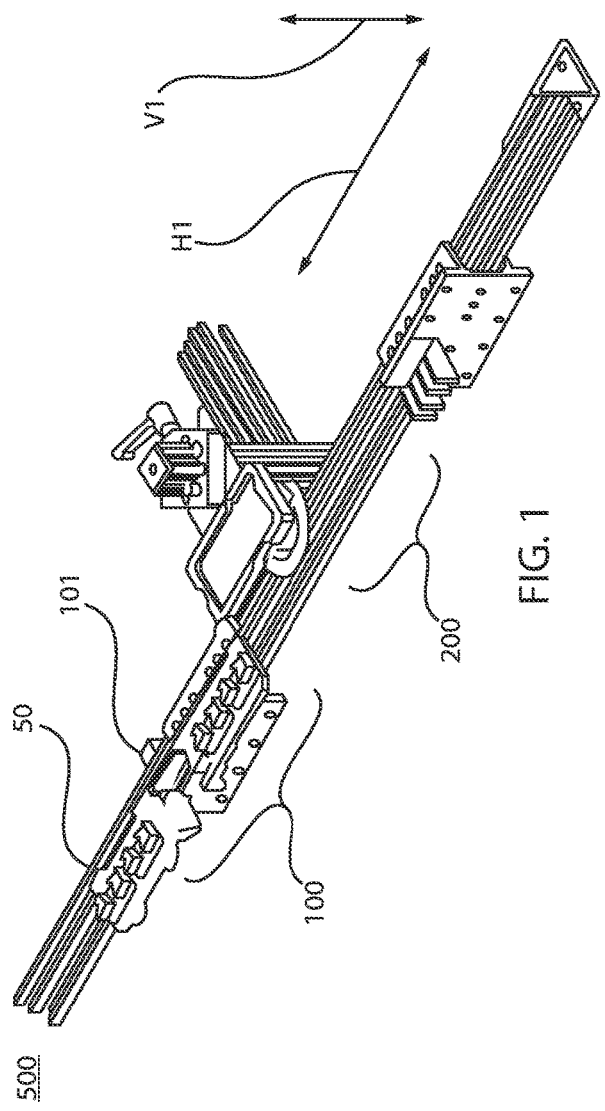
FIG. 1 is a perspective view of a system for imaging including a jig structure for engaging at least two terminal types to a sliding component of a rail system, in which the jig structure provides the same depth of focus for the at least two terminal types as traversed to a fixed imaging location of the rail system, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

The claimed structures and methods provide for imaging electrical components, such as the terminal connectors of cabling. The imaging methods and structures may provide for imaging in quality control. It has been determined that the challenge in inspecting highly integrated complex assemblies, is providing exceedingly efficient processes and tooling, while simultaneously balancing alpha risk (Type I—Overkill—Producer Risk) and beta risk (Type II—Escape—Consumer Risk). One method to increased efficiency is the adoption of artificial intelligence (AI) and machine learning (ML) coupled with deeper integration into production operations for imaging. In some embodiments, successful management and control of a rigid body's six degrees of freedom, in space, can provide for successful and repeatable imaging for analysis using artificial intelligence (AI) and machine learning (ML) methods.

As will be described below, the structures and methods of the present disclosure employ a jig structure that can fix multiple types of connectors at a same focus height along a vertical axis, while being engaged to a sliding rail system that provides for repeatably sliding the jig structure from a loading location for loading the connectors into the jig structure to an imaging location for imaging the connectors in a repeatable and rapid manner.

In some embodiments, the methods and structures of the present disclosure are integrated into a modular cable inspection assembly. The assembly enables a person to repeatably and consistently utilize artificial intelligence (AI) and machine learning (ML) with visual inspection. In this application, visual inspection is performed and supported with AI and ML iOS based algorithm to accurately inspect cables.

However, consistently inspecting the different types of cable connectors on the opposing sides of some cable designs using imaging methods can be problematic. It has been determined that in order to be successful, the imaging method has to accommodate different cable terminal geometries and fix those different cable types along a same point of focus. Additionally, the imaging inspection method should be performed in a repeatable manner.

Prior to the methods and structures of the present disclosure, the cycle time to inspect one cable is approximately 30 minutes. When employing some embodiments of the imaging systems and jig structures that are described below with reference to FIGS. 1-10, the cycle time to inspect one cable can be reduced to approximately 5 minutes. The methods and structures of the present disclosure are now described with more detail referring to FIGS. 1-10.

Figure 2:
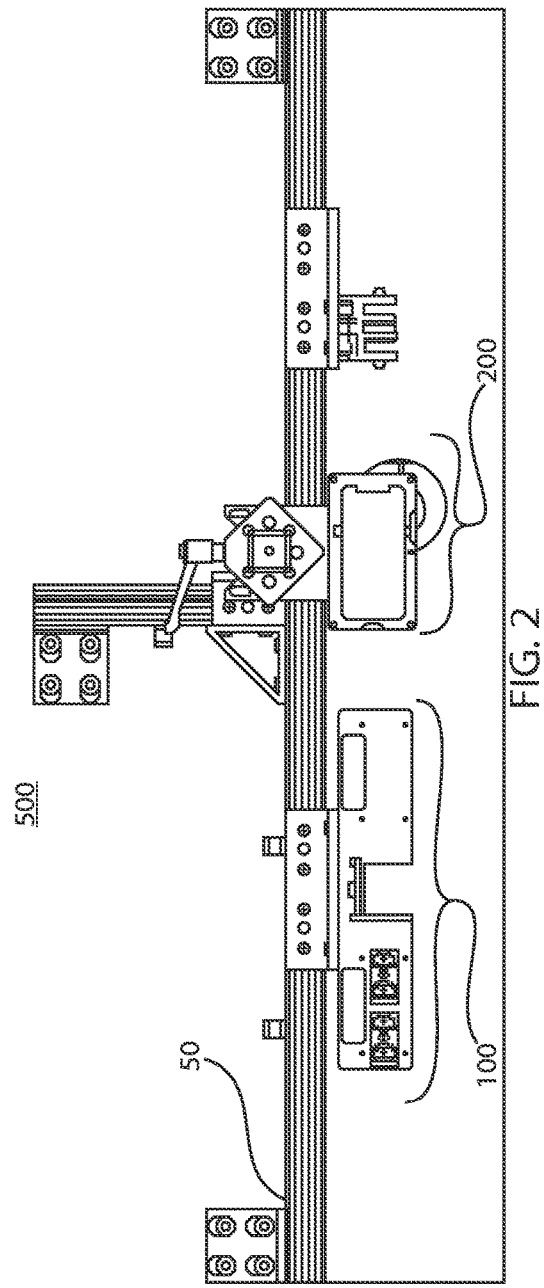
FIG. 2 is a top down view of the imaging system that is depicted in FIG. 1.
Figure 3:
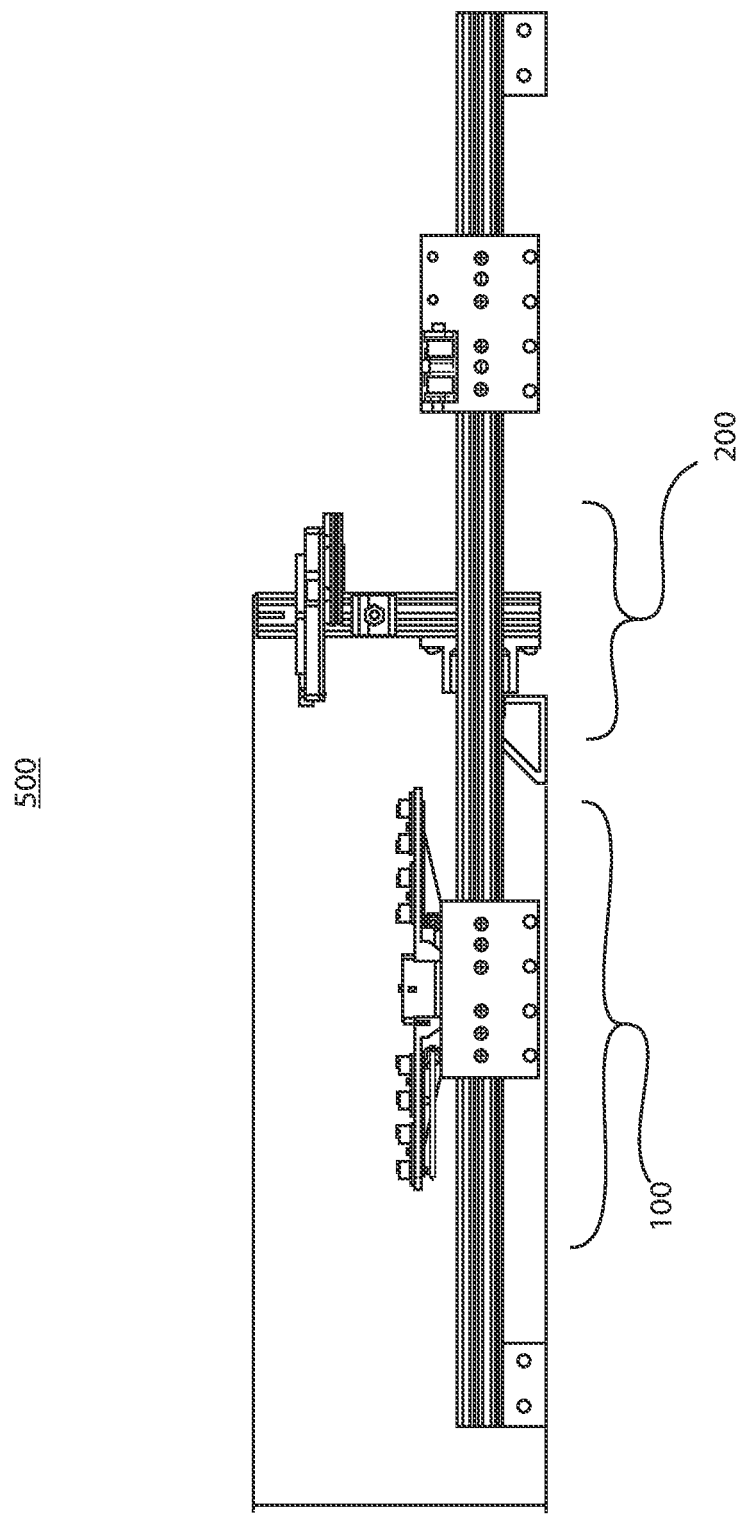
FIG. 3 is a side view of the imaging system that is depicted in FIG. 1.

FIGS. 1-3 illustrate one embodiment of a system 500 for imaging including a jig structure 100 for engaging at least two terminal types to a sliding component of a rail system 50, in which the jig structure 100 provides the same depth of focus for the at least two terminal types as traversed to a fixed imaging location of the rail system 50. It is noted that although the methods and structures described herein are described with reference to inspecting a cable structure including at least two different terminal types, the methods and structures described herein are not limited to only this type of structure. Any structure for inspection using imaging methods may be incorporated into the designs and structures described herein.

In one embodiment, the system 500 includes at least an image capture device 200, a rail system 50, and a jig structure 100 for engaging the terminals of a cable structure.

In one embodiment, the rail system 50 includes a stationary component connected to the image capture device 200 and a sliding component for movement along a horizontal axis H1, in which the sliding component of the rail system 50 is connected to the jig structure 100. The rail system 100 may have a rail that can be provided by an aluminum extrusion. The rail provides the track upon which the sliding component can travel. The sliding component of the rail system 50 may being in rolling engagement with the rail. The rolling engagement of the sliding component may be provided by roller bearings. As will be described in further detail below, a jig structure 100 that the subjects (e.g., connectors) to be imaged are mounted in is engaged to the sliding component of the rail system 50. The image capture device 200 is mounted to the rail of the rail structure. The image capture device 200 is mounted to the rail, and is therefore fixed at one horizontal location, which may be referred to as the imaging location. The jig structure 100 is engaged to the sliding component of the rail system 50, which allows for the jig structure 100 including the subjects to be imaged to be traversed from left to right, and vice versa, past the imaging location at which the image capture device 200 is mounted in a fixed position. It is noted that the above description of the rail system 50 is provided for illustrative purposes only, and is not intended to limit the present disclosure.

In one embodiment, the jig structure 100 includes a base 101 first mount location M1 having a reversible mount arrangement for engagement to a first type connector, and a second mount location M2 having a slot housing for engagement to a second type connector. The first connector type and the second connector type can have different geometries. For example, in one embodiment, the first connector type engaged by the at least one cable terminal retention housing 102 can have a male geometry connector type, and the slot housing for engagement to the second type connector can be configured for a female geometry connector. The jig structure 100 is engaged to the sliding component to position the jig structure 100 so that the first and second mount locations M1, M2 are in line and parallel to a direction of travel along the horizontal axis H1 including a point at which the first and second mount locations M1, M2 pass through the imaging location. The "imaging location" is the fixed point at which the image capture device 200 has been focused to take an image of the items to be inspected that are retained, i.e., fixed, into the jig structure 100. For example, the items retained in the image capture device 200 may be connector terminals. More specifically, the pin structures of the connectors may be recorded and analyzed for quality. For example, the connector terminals can be the connectors at the opposing ends of a connecting cable. The connectors at the opposing ends of the cable may have different geometries at each end of the cable, and the number of connectors may also differ. For example, one end of the cable may have four separate cable connectors, while the opposing end of the cable may including only one cable connector. The jig structure 100 may be configured to simultaneously retain each of the connectors for imaging. For example, the first mount location M1 may include retaining structures, e.g., cable terminal retention housing 102, for engaging multiple connectors of a first end of a cable, while the second mount location M2 may include a slot for engaging a single connector of a different type than the connectors engaged at the first mount location M1. The jig structure 100 may also be configured to compensate for the different dimensions of the different connector types. More specifically, the engagement provided by the slot at the second mount location M2 and the engagement provided by the cable terminal retention housing 102 at the first mount location M1 are configured to provide that the uppermost height of the connectors, i.e., first and second type connectors, at these locations is the same. This provides that the depth of field for the portion of the first and second connector types engaged to the first and second mount locations M1, M2 is the same relative to the image capture device 100 at the imaging location.

The depth of field (DOF) is the distance between the nearest and the farthest objects and the image capture device 200 that are in acceptably sharp focus in an image. The depth of field can be calculated based on focal length, distance to subject, the acceptable circle of confusion size, and aperture.

As noted, the jig structure 100 is engaged to the sliding component of the rail system 50, which can be traversed along a horizontal axis H1 from a loading position for loading the first and second connector types into the jig structure 100 to the imaging location at which the image capture device 200 can take an image of the first and second type connectors, as they pass through the imaging location. Because the first and second type connectors are fixed in the jig structure 100 at the same depth of field relative to the image capture device 200, taking images of the first and second type connectors is efficient, and does not require independent adjustments of the height of the first and second connectors along a vertical axis V1 to record images of the first and second type connectors that are in focus.

In some embodiments, the imaging system 500 that is depicted in FIGS. 1-3 may be employed in a method of imaging that can include mounting a cable including at least two terminal connector types to a jig structure 100 comprising a first mount location M1 having a reversible mount arrangement for engagement to a first type connector and a second mount location M2 having a slot housing for engagement to a second type connector. By "reversible mount arrangement" it is meant that the connectors can be both engaged to and both removed from the first mount location M1, e.g., the connector can be engaged to and both removed from the cable terminal retention housing 102 at the first mount location M1. By "reversible" it is meant the connection is temporary. The first type connector may be mounted in a fixed position in the cable terminal retention housing 102 for imaging at the first mount location M1, in which following imaging the first type connector may be ejected from the cable terminal retention housing 102 for removal of the cable including the first and second connector types from the jig structure 100. In some embodiments, at least one of the cable terminal retention housing 102 and the slot at the second mount location M2 has a geometry configured for friction fit to their respective connector type that is engaged thereto for imaging. By "friction fit", it is meant that the dimensions of the connector type and the engaging faces of the cable terminal retention housing 102 and/or the slot at the second mount location M2 are selected to provide a sufficient force upon the connector type to reversibly engage it to their respective mount for imaging.

The method may further include mounting the jig structure 100 to the sliding component of the sliding rail system 50. The mounting of the jig structure 100 to the sliding component of the sliding rail system 50 may be performed prior to the connectors being engaged to the jig structure 100. The jig structure 100 may be engaged to the sliding component of the rail system 50 to position the first and second mount locations M1, M2 to be in line and parallel to a direction of travel along a horizontal axis H1 including a point at which the first and second mount M1, M2 locations pass through the imaging location.

The method may further include taking images of the first and second type connectors with an image capture device 200 mounted to a fixed component of the sliding rail system 50 when the first and second mount locations M2 of the jig structure 100 that is mounted to the sliding component pass through the imaging location.

In some embodiments, the images of the first and second type connectors that are being taken are recording a pin structure for each of the first and second type connectors. As noted, in some embodiments, the first and second type connectors can be the connectors at the opposing ends of a connecting cable. As noted above, the jig structure 100 may include at least one cable terminal retention housing 102 at the first mounting location M1 for engaging the first type connectors, and the jig structure 100 may include a slot at the second mounting location M2 for engaging the second type connectors. The slot and the at least one cable terminal retention housing 102 can be configured to position the face of the connectors so that the pin arrangements have the same depth of field relative to the image capture device 200, e.g., relative to the lens of the image capture device 200. In some embodiments, this provides that the at least one cable terminal retention housing 102 and the slot housing are configured to provide that the first and second connector types are at a same focus point when engaged to their mount points at the jig structure 100. In this example, as the jig structure 100 containing the connectors/cable is traversed along the horizontal axis H1 from the load point from the imaging location, images can be taken of the connectors, e.g., the faces of the connectors including the pin arrangement, for both the first connector type and the second connector type without requiring changes in the focus settings of the image capture device 200 between imaging the first and second connectors, and vice versa, as the jig structure 100 passes through the imaging location.

In some embodiments, the image capture device 200 has a smart phone form factor. However, this is only one example of a type of device that may be employed for the image capture device 200. For example, the image capture device 200 may be provided by another type of mobile computing device having imaging capability, such as a tablet computer. Additionally, the image capture device 200 may also be provided by any device having a lens for capturing an image, such as a photograph taking camera, or a video camera.

In some embodiments, the image capture device 200 may include an image analyzer, or the image capture device 200 may be in communication with a computing device including an image analyzer. In one embodiment, the image analyzer includes at least one form of memory for storing instructions to be executed by at least one hardware processors for performing analysis of pin layouts for the connectors that the images were taken using the image capture device 200. The image analyzer can employ machine learning (ML) and/or artificial intelligence (AI) to analyze the images taken at the imaging location and determine whether the subjects being recorded meet specific criteria for quality control. For example, the connectors, e.g., first type and second type connectors, may be imaged to ensure that the pin arrangements meet their required geometries for engagement into connectors on respective hardware.

Machine learning (ML) employs statistical techniques to give computer systems the ability to "learn" (e.g., progressively improve performance on a specific task) with data, without being explicitly programmed. The machine learning method that can be used to form a model for determining whether images of pin layouts from the image capturing device 200 at the imaging location meet the requirements for cable production can employ decision tree learning, association rule learning, artificial neural networks, deep learning, inductive logic programming, support vector machines, clustering analysis, bayesian networks, reinforcement learning, representation learning, similarity and metric learning, sparse dictionary learning, genetic algorithms, rule-based machine learning, learning classifier systems, and combinations thereof.

In some embodiments, the image analyzer can analyze pin layouts using a machine learning algorithm that can be selected from the group consisting of: Almeida-Pineda recurrent backpropagation, ALOPEX, backpropagation, bootstrap aggregating, CN2 algorithm, constructing skill trees, dehaene-changeux model, diffusion map, dominance-based rough set approach, dynamic time warping, error-driven learning, evolutionary multimodal optimization, expectation—maximization algorithm, fastICA, forward-backward algorithm, geneRec, genetic algorithm for rule set production, growing self-organizing map, HEXQ, hyper basis function network, IDistance, K-nearest neighbors algorithm, kernel methods for vector output, kernel principal component analysis, leabra, Linde-Buzo-Gray algorithm, local outlier factor, logic learning machine, LogitBoost, manifold alignment, minimum redundancy feature selection, mixture of experts, multiple kernel learning, non-negative matrix factorization, online machine learning, out-of-bag error, prefrontal cortex basal ganglia working memory, PVLV, Q-learning, quadratic unconstrained binary optimization, query-level feature, quickprop, radial basis function network, randomized weighted majority algorithm, reinforcement learning, repeated incremental pruning to produce error reduction (RIPPER), Rprop, rule-based machine learning, skill chaining, sparse PCA, state-action-reward-state-action, stochastic gradient descent, structured kNN, T-distributed stochastic neighbor embedding, temporal difference learning, wake-sleep algorithm, weighted majority algorithm (machine learning) and combinations thereof.

It is noted that the above examples of algorithms used for machine learning (ML)/artificial intelligence have been provided for illustrative purposes only. Any algorithm having applicability to matching images taken from the imaging location by the image capture device 200 to a standard by which a cable pin out can be measured as being suitable or not suitable can be substituted for the above examples.

It is noted that in one preferred example, the image capture device 200 may be a smart phone using an operating system (OS), such as iOS from Apple, Inc. In this example, the machine learning/artificial intelligence employed for the image analyzer may be embodied in an app, i.e., mobile application, e.g., for a smart phone. It is noted that this is only one example, and the present disclosure is not intended to be limited thereto. The OS can be implemented with any suitable OS, mobile or otherwise, such as, for example, Android OS from Google, Inc., and Windows OS from Microsoft Corp; and/or a combination of any one or more thereof.

The imaging system 500 provides a stable structure by which images can be taken for analysis in a repeatable and time efficient manner. In some embodiments, in which a smart phone that provides the image capture device 200, a fixture 201 (also referred to as upper housing 201) can be provided that includes an alignment tab 205, wherein the alignment tab 205 aligns an image taking portion of the smartphone to the imaging location on the direction of travel H1. As noted, the jig structure 100 provides for mounting the first and second connectors so that they the same depth of focus as they travel through the imaging location. The jig structure 100 is fixed to the sliding component of a rail system, and can be traversed along a constant horizontal axis, i.e., along a straight line. The alignment tab 205 is used to provide that the lens of the image capture device 200, e.g., the smartphone, is aligned with the point at the imaging location at which the structures from which recorded images are to be taken.

Referring to FIGS. 1-3, as noted the jig structure 100 includes at least one cable terminal retention housing 102 configured for retaining the first type connector by the reversible mount arrangement to the first mount location M1. The second mount location M2 also includes a slot that is configured for reversible mount arrangement of the second type connector.

This provides that following imaging, as described in the above method, the connectors, as well as the associated cable, may be removed from the jig structure 100. More specifically, after imaging, the jig structure 100 may be removed from the imaging location, by moving it along the horizontal axis to a location remote from the image capture structure 200. In some embodiments, once the jig structure 100 has been moved to a location that clears the image capture structure 200, the first connector types may be removed, e.g., ejected, from the at least one cable terminal retention housing 102 through the actuation of an ejection plate. In some embodiments, the jig structure 100 includes an ejection plate 104 including at least one ejection pin 105. The ejection plate 104 can be connected to the first mount location M1 of the base 101, and traversable across at least a first position and at least a second position. At the first position, the first connector type is retained to the at least one cable retention housing 102. In some embodiments, as the ejection plate 104 is traversed to the second position an ejection force is applied through the at least one ejection pin 105 to the first connector type to eject the first connector type from the at least one cable terminal retention housing 102.

Figure 4:
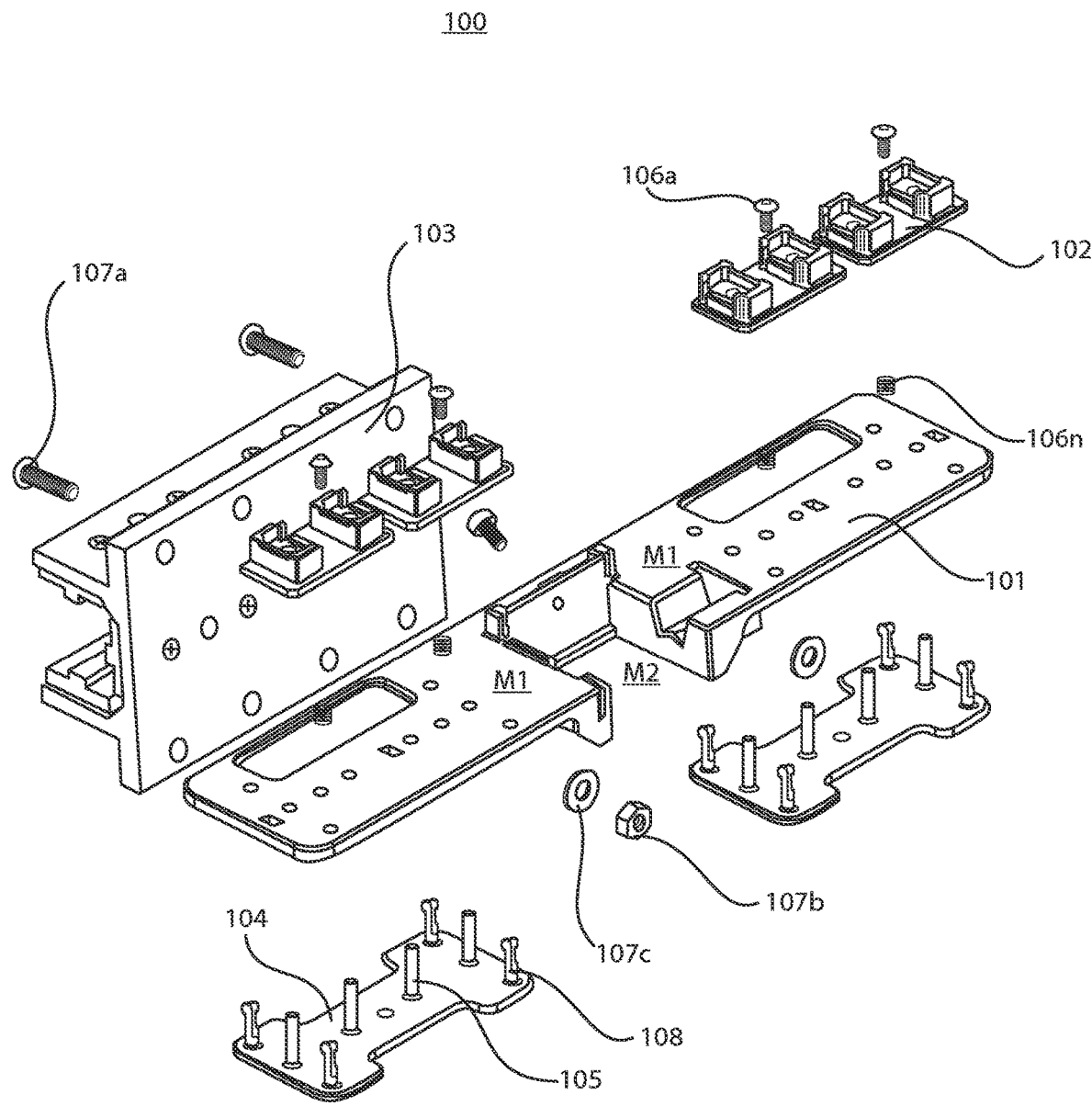
FIG. 4 is an exploded view of one embodiment of the jig structure depicted in FIG. 1.

FIG. 4 is an exploded view of one embodiment of the jig structure 100 depicted in FIG. 1. The jig structure 100 may include a base 101 having an adapter 103 for engagement to a sliding rail system that includes an imaging location. The base 101 and adapter 103 may each be composed of a rigid material, such as metal or plastic. The base 101 and the adapter 103 may each be constructed using modeling and additive manufacturing.

Figure 5:
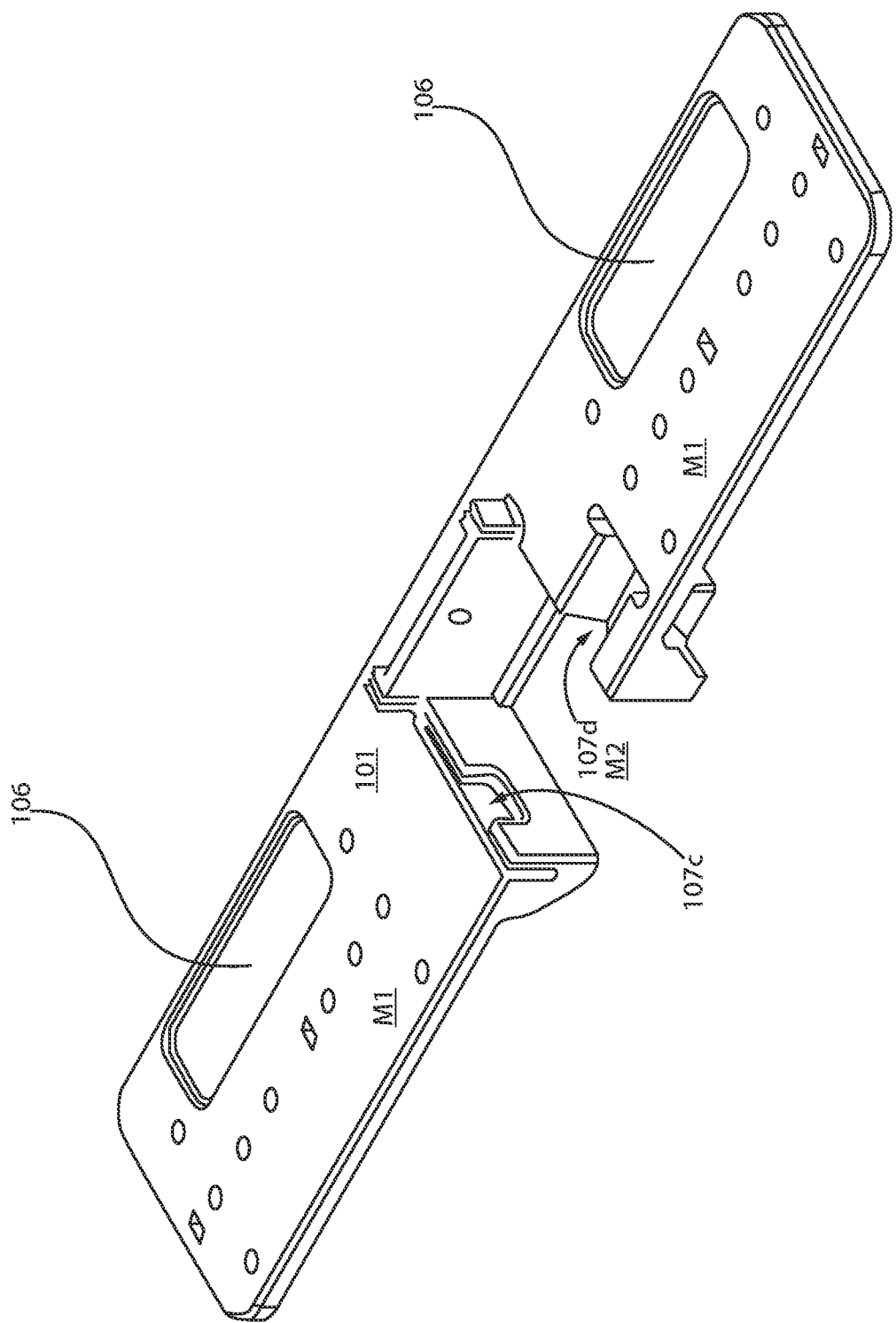
FIG. 5 is a perspective view of one embodiment of the base for the jig structure depicted in FIG. 4.

FIG. 5 illustrates one embodiment of the base 101 for the jig structure 100 depicted in FIG. 4. In one embodiment, the base 101 including a first mount location M1 having a reversible mount arrangement for engagement to a first type connector, and a second cable mount location M2 having a slot housing for engagement to a second type connector. In the example depicted in FIG. 5, there are two first mount locations identified by M1, and a single second mount location identified by M2. This is only one embodiment of the present disclosure, and the methods and structures described herein are not intended to be limited to only this example.

The slot at the second mount location M2 has a geometry for engaging a second connector type. The sidewall of the slot includes at least two notches 107c, 107d having a geometry to house in corresponding relationship the exterior surfaces of the second connector type. The notches 107c, 107d provide for one mechanism by which the second connector type can be engaged to the slot at the second mount location M2.

Figure 6:
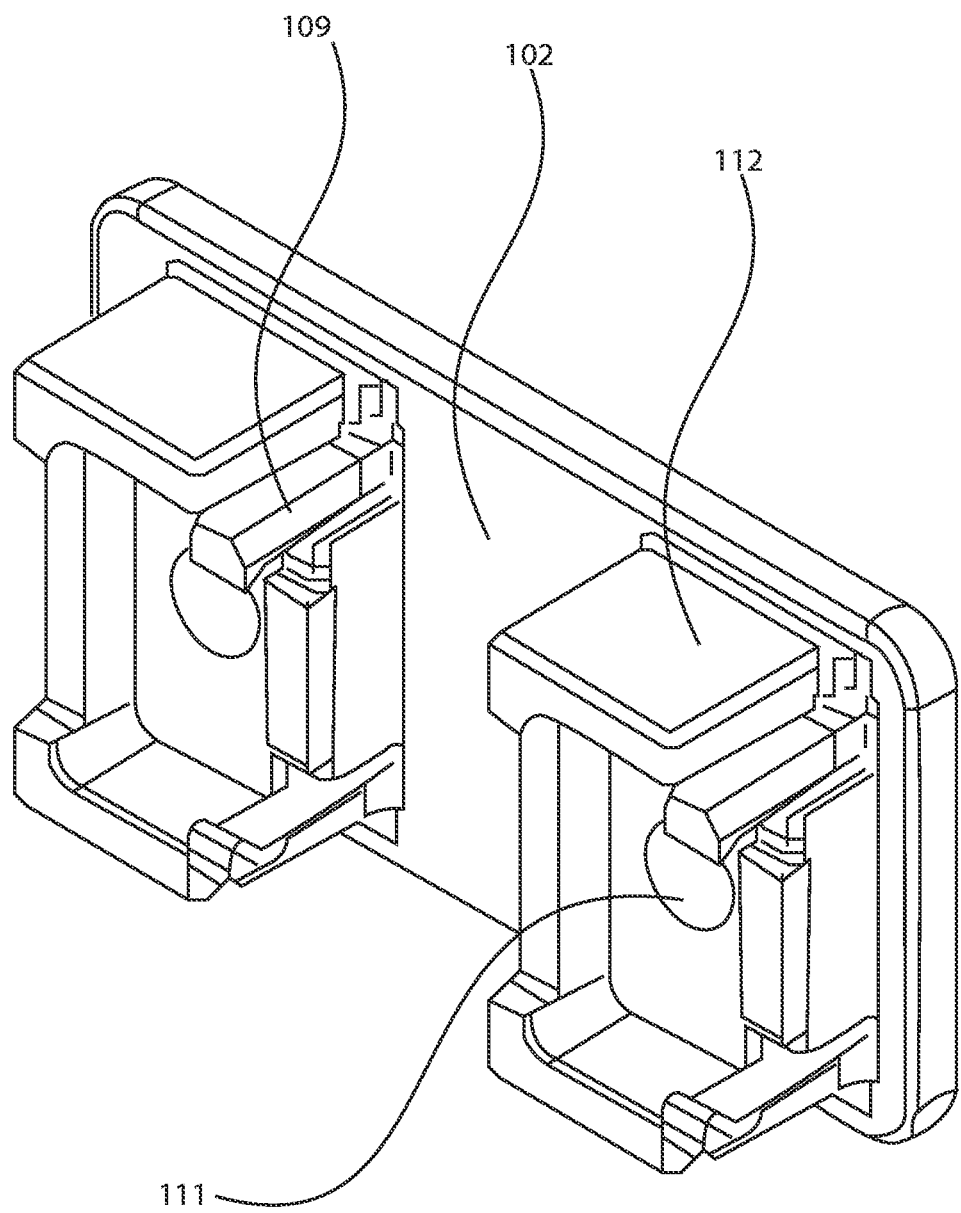
FIG. 6 is a perspective view of one embodiment of a reversible mount arrangement for engagement of a first type connector for a two terminal cable to the jig structure.

It is noted that in FIG. 5, the at least one cable retention housing 102 is not depicted at the first mounting locations M1. This is because the at least one cable retention housings 102 are separate from the base 101. FIG. 6 illustrates one embodiment of the at least one cable retention housing 102 that is engaged to the first mounting locations M1. FIG. 4 is an exploded view illustrating that the cable retention housings 102 may be engaged to the base 101 using fasteners 106a, 106n. The at least one cable terminal retention housing 102 is configured for retaining the first type connector, and the at least one cable terminal housing 102 is connected by the reversible mount arrangement to the first mount location M1. In the embodiment depicted in FIG. 4, the fasteners 106a, 106n include a bolt 106a and helicoil 106n, in which the helicoil may be embedded into the base 101. In some embodiments, by providing that the at least one cable retention housing 102 is reversibly engaged to the base 101, the at least one cable retention housing 102 may be easily serviced and replaced. For example, if the at least one cable retention housing 102 fails, e.g., breaks, the at least cable retention housing 102 can easily be removed and replaced through unbolting the fasteners 106a, 106n, removing the broken housing 102, installing a new housing 102, and then reinstalling the fasteners 106a, 106n.

Additionally, referring to FIG. 6, the at least one cable retention housing 102 has a geometry that is specific for engaging the geometry of the first connector type. The sidewall 112 of the engaging features for the at least one cable retention housing 102 have a geometry to house in corresponding relationship of the exterior surfaces of the first connector type. The engaging features for the at least one cable retention housing 102 may also include retailing clips 109. The retaining clips 109 include a protrusion at the end of the arm. The protrusion can engage a notch or surface of the at least one connector momentarily to secure the connector to the engaging feature of the housing 102. The retaining clips 109 can momentarily deflect to allow for protrusion to engage and disengage the surfaces of the first type connector that are used to secure it to the engaging feature.

In some embodiments, if the first connector type changes in geometry by design, the at least one cable retention housing 102 may also be changed to accommodate the design changes while still using the remainder of the imaging device 500 without modification. The at least one cable retention housings 102 may be produced using modeling and additive manufacturing. The at least one cable retention housing 102 may be composed of a plastic or metal material.

Referring to FIGS. 4 and 5, it is noted that two trays 106 are positioned proximate to each of the first mount locations M1. In some embodiments, the first type connectors that are engaged to the retention housing at the first mount locations M1 has caps to protect the pins during shipping/handling prior to installation. During inspection of the cable, the caps are removed to expose the pin face. The trays 106 can serve as a location for storing the caps during imaging of the pin faces.

Referring to FIGS. 4 and 5, the adapter 103 is configured to position the base 101 so that the first and second mount locations M1, M2 are in line and parallel to a direction of travel, e.g., along the horizontal axis H1, for the base 101 along the rail system 50 including a point at which the first and second mount locations M1, M2 pass through the imaging location. FIG. 4 is an exploded view illustrating that the adapter 103 may be engaged to the base 101 using fasteners 107a, 107b, 107c. In the embodiment depicted in FIG. 4, the fasteners 107a, 107b, 107c include nut and threaded bolt arrangements, e.g., a bolt 107a, bolt 107b and washer 107c.

Referring back to FIGS. 4 and 7, the imaging device 500 also includes an ejection plate 104 including at least one ejection pin 105, the ejection plate 104 connected to the first mount location M1 of the base 101, and traversable across at least a first position and at least a second position, wherein at the first position the first connector type is retained to the at least one cable retention housing 102. In some embodiments, as the ejection plate 104 is traversed to the second position an ejection force is applied through the at least one ejection pin 105 to the first connector type to eject the first connector type from the at least one cable terminal retention housing 102. The ejection plate 104 is guided from the first position to the second position by guide pins 108 that engage the base 101. In some embodiments, the ejection plate 104 is present on a back face surface of the base 101 that is opposite a front surface of the base 191 engaged by the at least one cable terminal retention housing 102. In some embodiments, the cable terminal retention housing 102 and the base 101 have communicating openings for receiving the at least one ejection pin 105 to contact the first connector type within the at least one cable terminal rejection housing 102. For example, the ejection pin 105 can contact the first connector type engaged to the at least one cable terminal retention housing 102 through an ejection pin opening 111, as depicted in FIG. 6. In some embodiments, the at least one ejection pin 105 contacts a back terminal housing surface of the first connector type that obstructs the at least one ejection pin 105 from contacting the connection pins of the first connector type.

Figure 7:
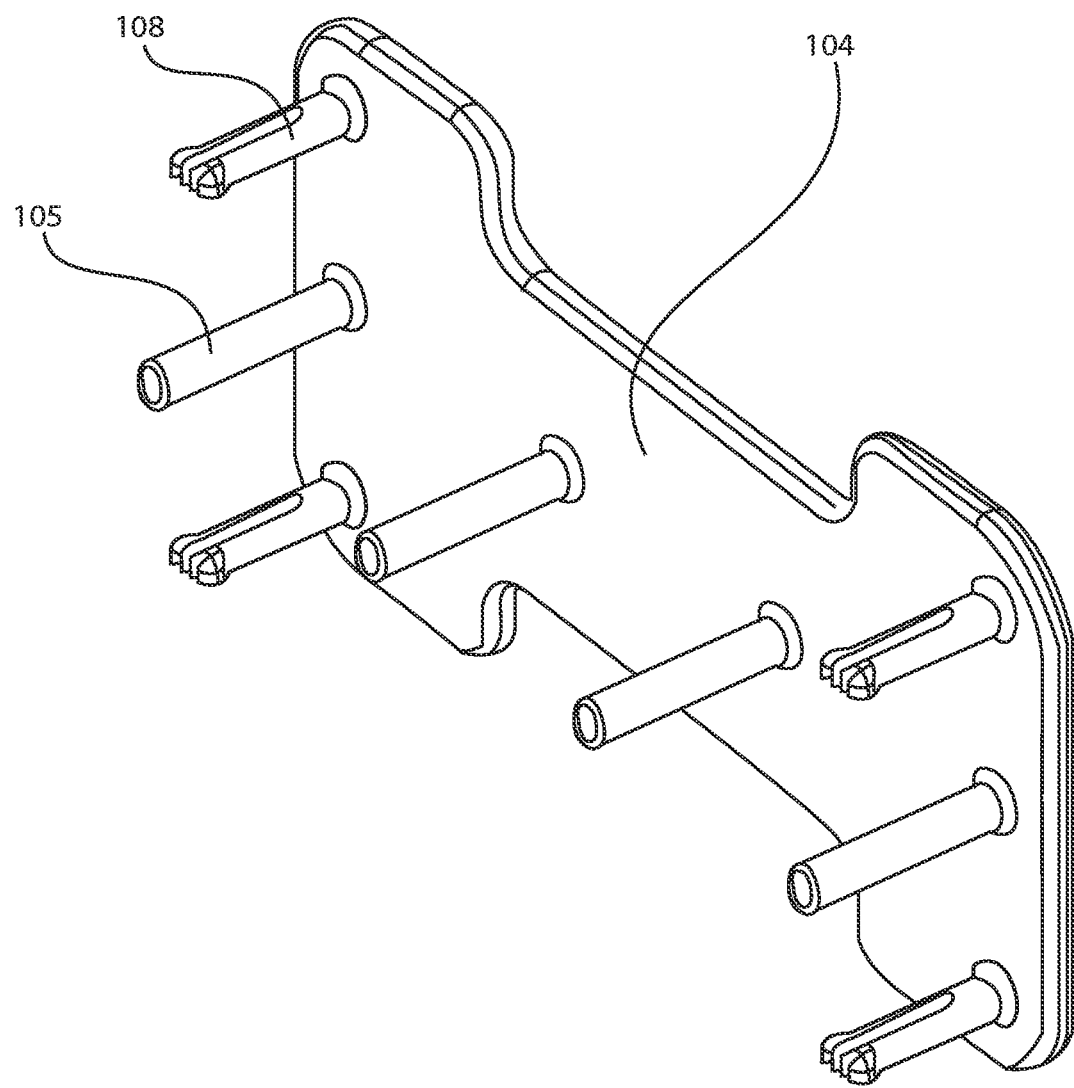
FIG. 7 is a perspective view of an ejection plate for jig structure depicted in FIG. 4.

Referring to FIGS. 4, 6 and 7, the ejector plate 104 provides for a single ejection of multiple cable heads with a single actuation of the ejector plate 104.

Figure 8:
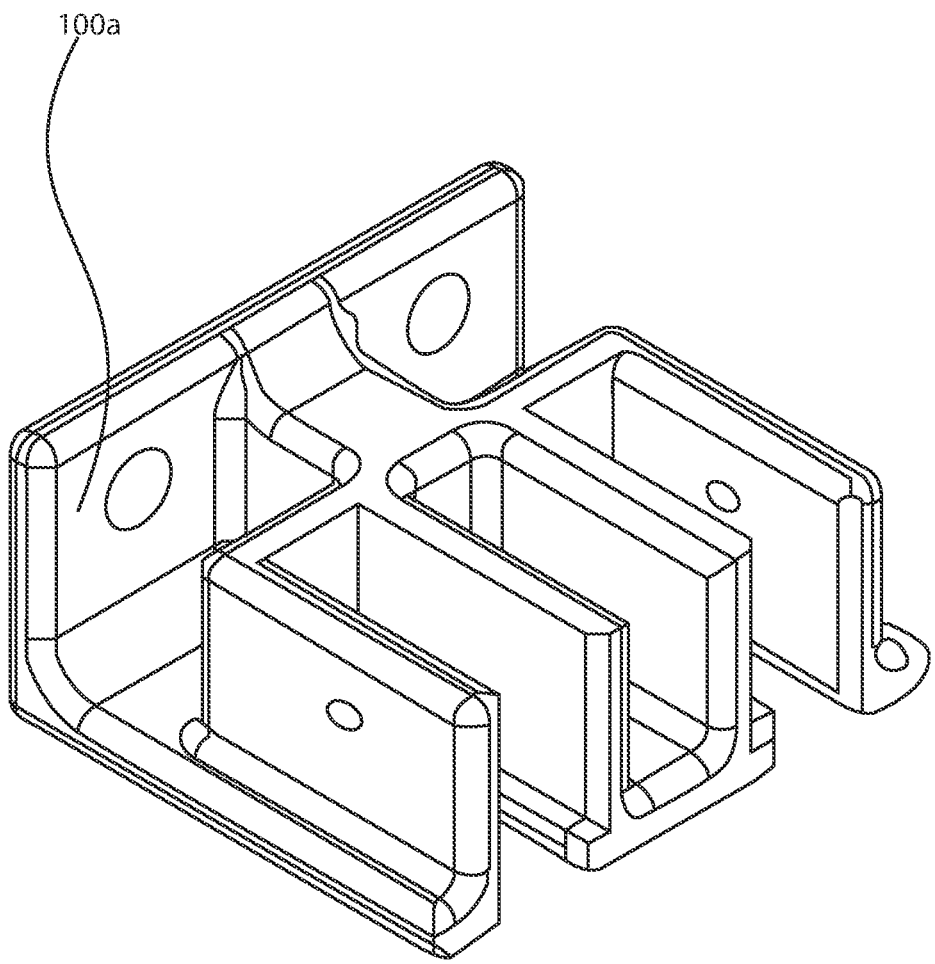
FIG. 8 is a perspective view illustrating another embodiment of a jig structure for use with the imaging system that is depicted in FIG. 1.

It is noted that the jig structure 100, and its related components, as depicted in FIGS. 1-7, collectively represent one embodiment of the present disclosure. It is not intended that the methods and structures be limited to only the details provided with the description of FIGS. 1-7, which have been provided for illustrative purposes only. Other geometries of the jig structure 100 are also possible. For example, FIG. 8 is a perspective view illustrating another embodiment of a jig structure 100a for use with the imaging system that is depicted in FIG. 1. The jig structure 100a depicted in FIG. 8 is a unitary structure that can provide for engaging a third geometry type connector, e.g., third connector type. It is also noted that both the jig structure 100 depicted in FIGS. 1-7, and the jig structure 100a depicted in FIG. 8, may simultaneously be mounted to different sliding components of the rail structure. This provides that both jigs may be used for inspection duties at the same imaging location.

Figure 9:
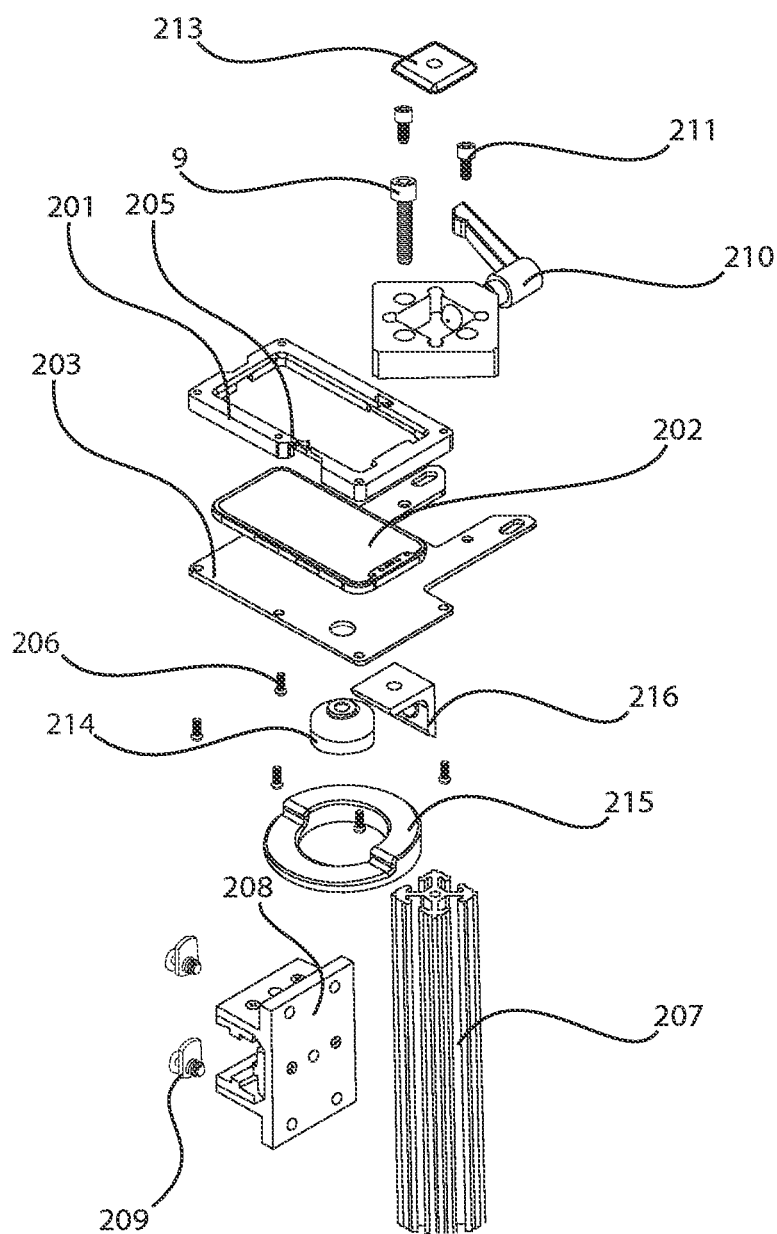
FIG. 9 is an exploded view of an image capture device and its connecting structures providing for fixed engagement to the imaging location on the sliding rail system, in accordance with one embodiment of the present disclosure.

FIG. 9 is an exploded view of an image capture device assembly 200 and its connecting structures providing for fixed engagement to the imaging location on the sliding rail system 50. As noted above, the image capture device 200 may be provided by a smart phone 202. In the example depicted in FIG. 9, the smart phone 202 can be housed within an image capture device jig that includes an upper housing 201 having the above described alignment tab 205 and a lower housing 203. The upper housing 201 and lower housing 203 have a geometry to receive the smart phone 202 in a fixed position therebetween. The smart phone 202 may include a mobile application, i.e., that provides an image analyzer using artificial intelligence/machine learning to characterize pin characteristics from the first and second connector type.

Figure 10:
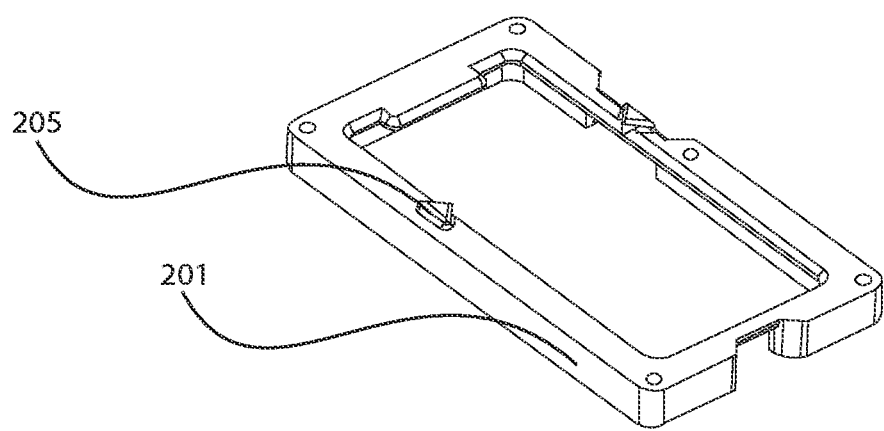
FIG. 10 is a perspective view of a fixture for housing the image capture device in the system for imaging that is depicted in FIG. 1, in accordance with one embodiment of the present disclosure.

The upper housing 201 and the lower housing 203 are engaged to one another to provide a housing structure containing the smart phone 202. The upper housing 201 and lower housing 203 are reversible engaged to one another using fasteners 206. For example, the fasteners 206 may be threaded bolts that engage threaded bosses in the upper housing 201. As described above, the upper housing 201 provides the image capture device, e.g., smart phone 202, is mounted in a fixture, e.g., the combination of the upper and lower housings 201, 203, having an alignment tab 205, wherein the alignment tab 205 aligns an image taking portion of the smartphone 202 to the imaging location on the direction of travel on the rail system 50. FIG. 10 is a perspective view of one embodiment of the upper housing 201 including an alignment tab 205 for housing the image capture device, e.g., smart phone, in the system for imaging that is depicted in FIG. 1.

Referring back to FIG. 9, the image capture device assembly 200 may also include a vertical beam 207 that connects the assembly of the upper housing 201, smart phone 202, and lower housing 203 to the fixed component of the rail system 50 at the imaging location. The vertical beam 207 may be an extrusion of metal, but other materials and geometries are also suitable. The vertical beam 207 may be engaged to the fixed component of the rail system 50 by an adapter plate 208 using fasteners 209, e.g., threaded bolts. The vertical beam 207 may also have a cap 213 at the uppermost surface of the structure.

Direct engagement of the assembly of the upper housing 201, smart phone 202, and lower housing 203 to the vertical beam 207 can be provided by linkage structure 210. The linkage structure 210 has an opening for engaging the vertical beam 207 in sliding engagement along a vertical axis V1. The linkage structure 210 is engaged to the lower housing 201 using fasteners 211, e.g., threaded bolts. The sliding engagement along the vertical axis V1 provides for the image capture device, e.g., smart phone 202, to be traversed upwards and downwards relative to the imaging location. This movement can aid in focusing the image taking device for taking images of the subjects, e.g., first and second connector types, that are retained in the jig structure 100 as they move through the imaging location. The linkage structure 210 may also include a lever 212 for a clamp type structure, which can engage the vertical beam 207 to fix the linkage structure 210, as well as the connector assembly of the upper housing 201, smart phone 202, and lower housing 203, at the selected vertical height along the vertical axis.

Still referring to FIG. 9, in some embodiments, the image capture device assembly 200 may further include a lens hood assembly 214, 215. The lens hood assembly 214, 215 is mounted to the lower housing 203. Provisions can be provided through the lens hood assembly for any supplemental lens arrangement, such as light augmentation, filters, protectors, light controlling elements, and magnification to the lens of the smart phone 202. In one example, the supplemental illumination is provided by the structure having reference number 215, which can be a light emitting diode (LED) ring. The structure identified by reference number 216 is mounted to the vertical beam having reference number 207. The structure having reference number 216 provides for finer focal length adjustment of the linkage structure 201.

The methods and structures described above with reference to FIGS. 1-10 can provide a modular inspection assembly that allows for cable translation, e.g., along a rail system, to an imaging location that allows for repeatable analysis using artificial intelligence (AI) and machine learning (ML). The structures described herein provide specific constrained degrees of freedom with controlled kinematics. A rigid body in space has six degrees of freedom. The structures and systems described herein allow for independent control and required translation along at least three orthogonal axis.

It is to be understood that aspects of the present invention will be described in terms of a given illustrative architecture; however, other architectures, structures, materials and process features, and steps can be varied within the scope of aspects of the present invention.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary structures at the interface of the two elements.

It will also be understood that when an element such as a layer, or region or structure is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below", or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A jig system for imaging comprising:
an image capture device assembly comprising an image capture device mounted in a fixture having a housing including mounting points for supplemental illumination, wherein the supplemental illumination provides lighting independent of the image capture device;
a sliding rail system having a stationary component connected to the image capture device assembly and a sliding component for movement along a horizontal axis; and
a jig structure comprising a base having an adapter for engagement to the sliding rail system that includes an imaging location, the base including a first mount location having a reversible mount arrangement for engagement to a first type cable connector and a second mount location having a slot housing for engagement to a second type cable connector, wherein the adapter is configured to position the base so that the first and second mount locations are in line and parallel to a direction of travel for the base along the sliding rail system including a point at which the first and second mount locations pass through the imaging location, and at least one cable terminal retention housing configured for retaining the first type cable connector, the at least one cable terminal retention housing connected by the reversible mount arrangement to the first mount location.

2. The jig system of claim 1, wherein the jig structure further comprises an ejection plate including at least one ejection pin, the ejection plate connected to the first mount location of the base, and traversable across at least a first position and at least a second position, wherein at the first position the first type cable connector is retained to the at least one cable terminal retention housing, and as the ejection plate is traversed to the second position an ejection force is applied through the at least one ejection pin to the first type cable connector to eject the first type cable connector from the at least one cable terminal retention housing.

3. The jig system of claim 1, wherein the direction of travel for the base along the sliding rail system to the imaging location is a first direction that is horizontal.

4. The jig system of claim 1, wherein the at least one cable terminal retention housing has a geometry for friction fit to a terminal of the first type cable connector.

5. The jig system of claim 1, wherein the first type cable connector is retained in the at least one cable terminal retention housing to provide that an exposed pin face of the first type cable connector is positioned to be imaged when the first mount location passes through the imaging location.

6. The jig system of claim 2, wherein the ejection plate is present on a back face surface of the base that is opposite a front surface of the base engaged by the at least one cable terminal retention housing, wherein the at least one cable terminal retention housing and the base having communicating openings for receiving the at least one ejection pin to contact the first type cable connector within the at least one cable terminal rejection retention housing.

7. The jig system of claim 6, wherein the at least one ejection pin contacts a back terminal housing surface of the first type cable connector that obstructs the at least one ejection pin from contacting connection pins of the first type cable connector.

8. The jig system of claim 1, wherein the first type cable connector engaged by the at least one cable terminal retention housing has a male geometry connector type, and the slot housing for engagement to the second type cable connector is configured for a female geometry connector.

9. The jig system of claim 1, wherein the at least one cable terminal retention housing and the slot housing are configured to provide that the first and second type cable connectors are at a same focus point when engaged to their respective said at least one cable terminal retention housing and said slot housing.

10. A system for imaging comprising:
   an image capture device assembly comprising an image capture device mounted in a fixture having an upper housing and a lower housing, the upper having an alignment tab, the lower housing including a mounting point for supplemental illumination, wherein the alignment tab aligns an image taking portion of the image capture device to an imaging location of a jig structure, and the supplemental illumination provides lighting independent of the image capture device;
   a rail system having a stationary component connected to the image capture device assembly and a sliding component for movement along a horizontal axis; and
   the jig structure engaged to the sliding component of the rail system, the jig structure comprising a first mount location having a reversible mount arrangement for engagement to a first type cable connector and a second mount location having a slot housing for engagement to a second type cable connector, wherein the jig structure is engaged to the sliding component to position the jig structure so that the first and second mount locations are in line and parallel to a direction of travel along the horizontal axis including a point at which the first and second mount locations pass through the imaging location.

11. The system of claim 10, wherein the jig structure comprises at least one cable terminal retention housing configured for retaining the first type cable connector, the at least one cable terminal retention housing connected by the reversible mount arrangement to the first mount location.

12. The system of claim 11, wherein the jig structure comprises an ejection plate including at least one ejection pin, the ejection plate connected to the first mount location of a base, and traversable across at least a first position and at least a second position, wherein at the first position the first type cable connector is retained to the at least one cable terminal retention housing, and as the ejection plate is traversed to the second position an ejection force is applied through the at least one ejection pin to the first type cable connector to eject the first type cable connector from the at least one cable terminal retention housing.

13. The system of claim 12, wherein the at least one cable terminal retention housing has a geometry for friction fit to the terminal of the first second type cable connector.

14. The system of claim 13, wherein the second type cable connector is retained in the at least one cable terminal retention housing to provide that an exposed pin face of the second type cable connector is positioned to be imaged when the second mount location passes through the imaging location.

15. The system of claim 10, wherein the image capture device has a smart phone form factor.

16. The system of claim 10, wherein the lower housing includes a lens hood assembly.

17. The system of claim 10 further comprising an image analyzer in communication with the image capture device, the image analyzer using artificial intelligence to characterize pin characteristics from the first and second type cable connectors.

* * * * *